United States Patent
Satoh et al.

(10) Patent No.: US 7,486,480 B2
(45) Date of Patent: Feb. 3, 2009

(54) HEAD GIMBAL ASSEMBLY METHOD WITH SOLDER FILLET FORMED BY LASER IRRADIATING A SHAPED SOLDER MASS

(75) Inventors: Takuya Satoh, Kanagawa (JP); Tatsushi Yoshida, Kanagawa (JP); Tatsumi Tsuchiya, Kanagawa (JP); Yoshio Uematsu, Kanagawa (JP)

(73) Assignee: Hitachi Global Storage Technolgies Netherlands B.V., AZ Amsterdam (NL)

( * ) Notice: Subject to any disclaimer, the term of this patent is extended or adjusted under 35 U.S.C. 154(b) by 428 days.

(21) Appl. No.: 11/355,470

(22) Filed: Feb. 15, 2006

(65) Prior Publication Data
US 2006/0193084 A1    Aug. 31, 2006

(30) Foreign Application Priority Data
Feb. 25, 2005    (JP) .............................. 2005-050641

(51) Int. Cl.
G11B 5/40 (2006.01)
B23K 35/14 (2006.01)

(52) U.S. Cl. ................... 360/234.5; 29/603.06; 29/878; 228/56.3

(58) Field of Classification Search .............. 360/234.5, 360/234.6, 245.8; 29/603.03, 603.06, 878; 228/56.3, 246
See application file for complete search history.

(56) References Cited

U.S. PATENT DOCUMENTS

| | | | | |
|---|---|---|---|---|
| 5,821,494 | A * | 10/1998 | Albrecht et al. | 219/121.64 |
| 6,318,624 | B1 * | 11/2001 | Pattanaik et al. | 228/56.3 |
| 6,523,250 | B2 * | 2/2003 | Erpelding et al. | 29/603.04 |
| 6,796,018 | B1 * | 9/2004 | Thornton | 29/603.04 |
| 2007/0012749 | A1 * | 1/2007 | Yamaguchi et al. | 228/179.1 |

FOREIGN PATENT DOCUMENTS

| | | |
|---|---|---|
| JP | 01-130590 | 2/1989 |
| JP | 07-106739 | 1/1995 |
| JP | 11-026918 | 1/1999 |

* cited by examiner

*Primary Examiner*—Jefferson Evans
(74) *Attorney, Agent, or Firm*—Townsend and Townsend and Crew LLP; John Henkhaus

(57) ABSTRACT

Embodiments of the invention relate to making reconnection when a soldered connection fails in a head/slider used in a magnetic disk drive. In one embodiment, a solder mass deposited on a slider pad of a head/slider is separated from a lead pad and a solder ball connection is yet to be made between the slider pad and the lead pad. A shaping tip is heated to a temperature near a melting point of a solder. The shaping tip is moved in parallel with a surface of the slider pad toward the side of the lead pad to soften the solder mass. The solder mass is thereafter irradiated with a laser beam so as to form a solder fillet, thereby making a soldered connection between the lead pad and the slider pad.

17 Claims, 13 Drawing Sheets

(A)

(B)

(A)  (B)

(A)

(B)

HEAD GIMBAL ASSEMBLY METHOD WITH SOLDER FILLET FORMED BY LASER IRRADIATING A SHAPED SOLDER MASS

CROSS-REFERENCES TO RELATED APPLICATIONS

This application claims priority from Japanese Patent Application No. JP2005-050641, filed Feb. 25, 2005, the entire disclosure of which is incorporated herein by reference.

BACKGROUND OF THE INVENTION

The present invention relates to a technique for connecting a slider pad and a lead pad of a head gimbal assembly included in a magnetic disk drive. More particularly, the present invention relates to a technique for making a soldered connection between the slider pad and the lead pad by re-irradiating a solder mass with a laser beam, the solder mass being deposited on the slider pad as a result of a solder ball being irradiated with the laser beam.

In the magnetic disk drive, a head formed in a slider (a structure integrating a head with a slider will hereinafter be referred to as a head/slider) flies above a surface of a magnetic disk with an extremely small gap from the surface and reads data from, or writes data to, the magnetic disk. The head/slider includes an air bearing surface (hereinafter referred to as ABS) formed on a surface thereof facing the magnetic disk. The ABS is structured such that positive pressure acting on the slider as a lifting force is produced when an air stream produced on the surface of a spinning magnetic disk flows past a space between the ABS and the surface of the magnetic disk. The ABS is also structured so as to produce negative pressure at other times for stabilizing attitudes during flying.

The head/slider is mounted on a spring structural body called flexure. While the head/slider flies above the surface of the magnetic disk, the flexure makes pivotal movement or gimbal movement so that the gap between the head and a magnetic layer of the disk may fall within a predetermined range. The flexure is mounted on a load beam which, in turn, is supported by an actuator assembly driven by a voice coil motor (hereinafter referred to as VCM). A structure having the head/slider, the flexure, a lead, and the load beam as main components thereof is called a head gimbal assembly (hereinafter referred to as HGA). The magnetic disk drive commonly includes a circuit board mounted with circuit devices for controlling data communications and the magnetic disk drive. Electric connection is made between the circuit board and the head using the lead. The head is embedded in the slider main body and connected to a slider pad formed on an end face of the head/slider. The slider pad is connected to a lead pad formed on an end portion of the lead using solder.

Examples of methods of connecting the slider pad to the lead pad using solder include a solder ball connection technique. The solder ball connection technique is superior as a soldering connection technique applicable to micromini sliders, since a soldered connection can be made with no mechanical stress applied to the slider pad or lead pad. FIG. 14 includes views for illustrating a condition in which the lead pad and the slider pad are connected together using the solder ball connection technique. FIG. 14(A) shows metal layers 319a, 319b, dielectric layers 317a, 317b, and a lead 321. The metal layers 319a, 319b constitute a flexure support structure. The dielectric layers 317a, 317b made of polyimide are stacked on the metal layers 319a, 319b, respectively. The lead 321 is formed by stacking a copper layer on top of the dielectric layer 317b. A head/slider 311 is mounted on the dielectric layer 317a with an ABS 323 opposing the magnetic disk facing up. A magnetic head is embedded internally in the head/slider 311 so as to achieve magnetic coupling between the magnetic head and the magnetic disk opposing the ABS 323. In addition, a slider pad 313 for connecting the magnetic head and the lead 321 is formed on a side surface on an end portion of the head/slider 311.

The metal layer 319a for supporting the head/slider 311 is called a flexure tongue. The flexure tongue makes gimbal movement or pivotal movement about a dimple formed in the load beam (not shown) as a pivot when the head/slider 311 flies above the magnetic disk surface. The lead 321 extends, in front of the slider pad 313, to a position to define a space 325 between the head/slider 311 and the lead 321. A lead pad 329 is formed at a leading end portion of the lead 321.

The solder ball connection technique typically follows these steps. Specifically, a solder ball 315 is temporarily deposited so as to come in contact with both the slider pad 313 and the lead pad 329. The solder ball 315 is then irradiated with a laser beam emitted from the direction of an arrow A and is thus melted. The laser beam is then shut down so that the melted solder cools down. A solder fillet 327 shown in FIG. 14(B) is thereby formed to make electric connection between the slider pad 313 and the lead pad 329. The solder ball connection technique is, however, associated with problems of improper connection unique thereto. Possible problems include: the molten solder attracted one-sidedly to either one of the pads during reflow of the solder ball 315 using laser energy, causing the solder fillet 327 to be connected only to one of the pads; an insufficient area of connection between the solder fillet 327 and the pads; a lack of sufficient connection strength; and a pad short-circuited with an adjacent one.

Patent Document 1 (Japanese Patent Laid-open No. 7-106739) discloses a technique that proceeds as below. Specifically, a mounting board is heated by a heater to a temperature level below a melting point of solder, thereby reducing peel strength of the solder ball relative to flux; an adhesion layer of an adsorption device is rollingly transferred onto the mounting board, thereby peeling the solder ball from the mounting board through adhesion. Patent Document 2 (Japanese Patent Laid-open No. 1-130590) discloses a technique, in which flux is softened by heated steam and the flux and a solder ball are removed by a blowing force. Patent Document 3 (Japanese Patent Laid-open No. 11-26918) discloses a technique in which solder is heated to a temperature at which the solder softens, and the solder is grounded off with a grinder.

BRIEF SUMMARY OF THE INVENTION

In processes for manufacturing the HGA, the soldered connection is visually inspected after the connection has been made with the solder ball between the slider pad and the lead pad. If a defect is found in the soldered connection between the lead pad and the slider pad, it has been conventional practice to treat the entire HGA as nonconformance. In later years, however, techniques have been developed in which the head/slider, if it is found to remain intact, is removed from the HGA for reuse. In view of boosting yield of HGAs and reducing component cost, however, it is desirable that the entire HGA be revitalized by subjecting solidified solder mass that has caused a connection failure to the reflow process, thereby forming a solder fillet.

It is therefore a feature of the present invention to provide a method of manufacturing the HGA by making a soldered connection between the lead pad and the slider pad by subjecting solder mass deposited on the slider pad of the head/slider to the reflow process. It is another a feature of the present invention to provide a method of manufacturing a magnetic disk drive in which the aforementioned HGA is built. It is still another feature of the present invention to provide an HGA manufactured through the aforementioned method.

According to a first aspect of the present invention, there is provided a method of manufacturing a head gimbal assembly. The manufacturing method comprises the steps of: providing a suspension assembly including a lead formed with a lead pad; mounting a head/slider formed with a slider pad on the suspension assembly; generating a solder mass deposited on the slider pad by irradiating a solder ball disposed between the slider pad and the lead pad opposing to each other at a predetermined angle with a laser beam; shaping the solder mass by softening the solder mass by heating the solder mass to a temperature equal to, or less than, a melting point; and forming a solder fillet between the slider pad and the lead pad by irradiating the shaped solder mass with a laser beam.

According to the manufacturing method of HGA according to the present invention, if a soldered connection between the lead pad and the slider pad is faulty when the solder ball is irradiated with a laser beam, the solder mass deposited on the slider pad is shaped so as to be suitable for reflowing and then irradiated with a laser beam to form a good solder fillet connecting the two pads. The present invention thus allows the HGA to be reused without discarding the HGA. Since the solder mass is softened by being heated to a temperature lower than the melting point, there is no likelihood that mechanical stress will be applied to the slider pad during shaping of the solder mass. Moreover, since a soldered connection is made by irradiating a previously shaped solder mass with a laser beam, soldering connection can be performed with high accuracy without allowing any mechanical force to be applied to a lead pad or a slider pad that has an intricate shape.

If the solder ball is formed of lead-free solder, mechanical stress applied to the slider pad can be eliminated when a shaping operation is performed particularly by softening through heating. If only an upper portion of the dome-shaped solder mass deposited on the slider pad is moved toward the lead pad, it is easy to form a solder fillet across the two pads through laser beam irradiation subsequently performed. As used herein, the solder fillet means solder that correctly connects the slider pad and the lead pad, and solder mass means solder that fails to connect correctly the slider pad with the lead pad.

Moving the solder mass to a position where part of the solder mass comes into contact with the lead pad allows a solder fillet connecting the two pads to be formed effectively through laser beam irradiation. Further, if the solder mass is brought to a stop immediately after part of the solder mass comes into contact with the lead pad, there is no likelihood that stress that can cause plastic deformation to the lead pad and the suspension assembly will be applied.

Use of a heated shaping tip for softening of the solder mass allows only the solder mass to be heated to a temperature near the melting point. The solder mass can thus be prevented from being melted or thermal stress can be prevented from being applied to the magnetic head. If the temperature of a surface on a leading end portion of the shaping tip is maintained in a temperature span ranging from the melting point of the solder to a value equivalent to the melting point less 20° C. while the shaping tip remains in contact with the solder mass, the solder mass in contact with the shaping tip while a shaping step progresses can be softened with a temperature less than the melting point.

A second aspect of the present invention provides a method of manufacturing a magnetic disk drive including a magnetic disk, a head gimbal assembly having a head/slider for accessing the magnetic disk, and an actuator assembly for supporting the head gimbal assembly. The method comprises the steps of: providing a suspension assembly including a lead formed with a lead pad; mounting a head/slider formed with a slider pad on the suspension assembly; generating a solder mass deposited on the slider pad by irradiating a solder ball disposed between the slider pad and the lead pad opposing to each other at a predetermined angle with a laser beam; shaping the solder mass by softening the solder mass by heating the solder mass to a temperature equal to, or less than, a melting point; and forming a solder fillet between the slider pad and the lead pad by irradiating the shaped solder mass with a laser beam.

A third aspect of the present invention provides a head gimbal assembly. The head gimbal assembly comprises: a suspension assembly including four leads, each being formed with a lead pad; and a head/slider secured to the suspension assembly, the head/slider including two slider pads for a write head and two slider pads for a read head. Each of the slider pads is formed by gold-plating a seed layer. A solder fillet generated by reflowing solder through laser beam irradiation is formed between each pair of the four slider pads and corresponding ones of the lead pads. Any one of the four slider pads has a width smaller than a width of any one of the rest of the slider pads.

According to the present invention, a method of manufacturing the HGA can be provided by reflowing the solder mass deposited on the slider pad of the head/slider and thereby making a good soldered connection between the lead pad and the slider pad. A method can also be provided of manufacturing a magnetic disk drive that includes such an HGA. Further, an HGA manufactured through the aforementioned steps can be provided.

DETAILED DESCRIPTION OF THE INVENTION

Figure 1:
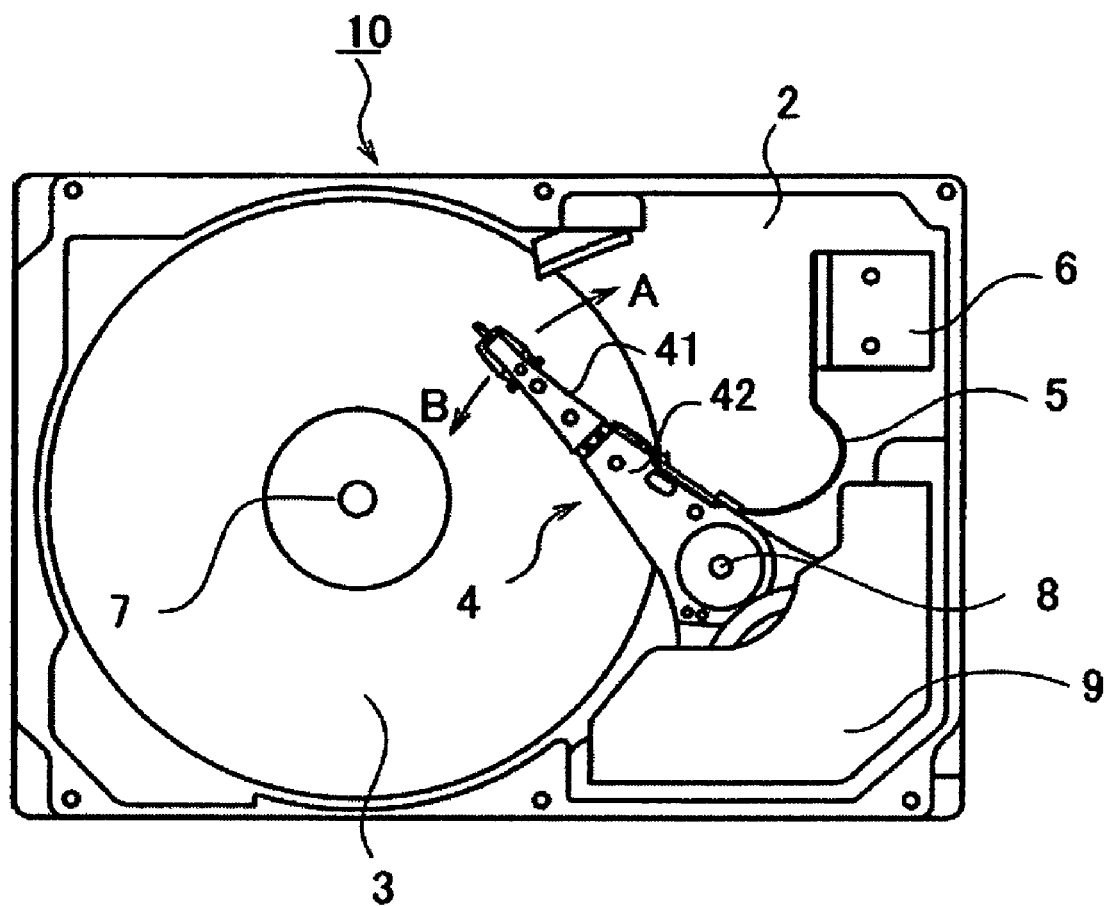
FIG. 1 is a plan view showing a magnetic disk drive according to an embodiment of the present invention.
Figure 2:
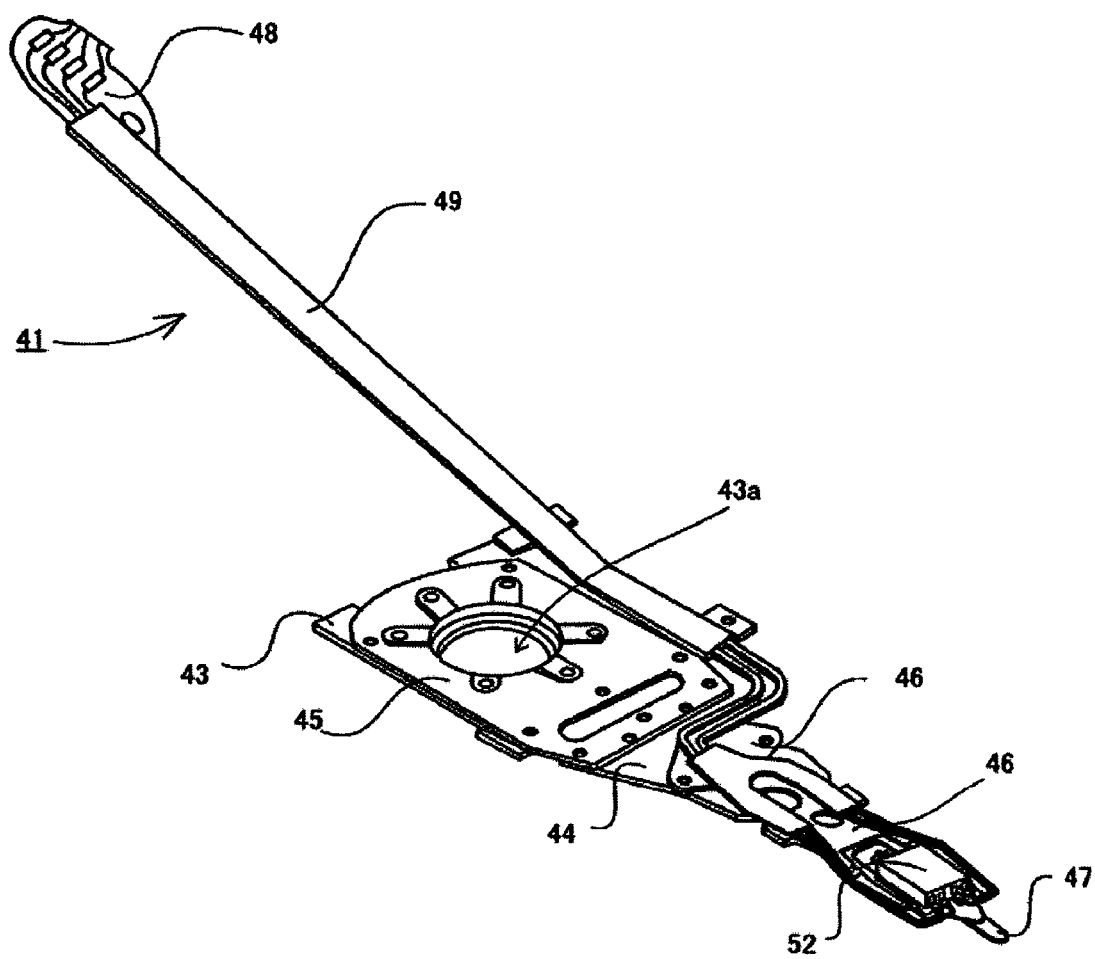
FIG. 2 is a perspective view showing a general construction of an HGA according to an embodiment of the present invention.
Figure 3:
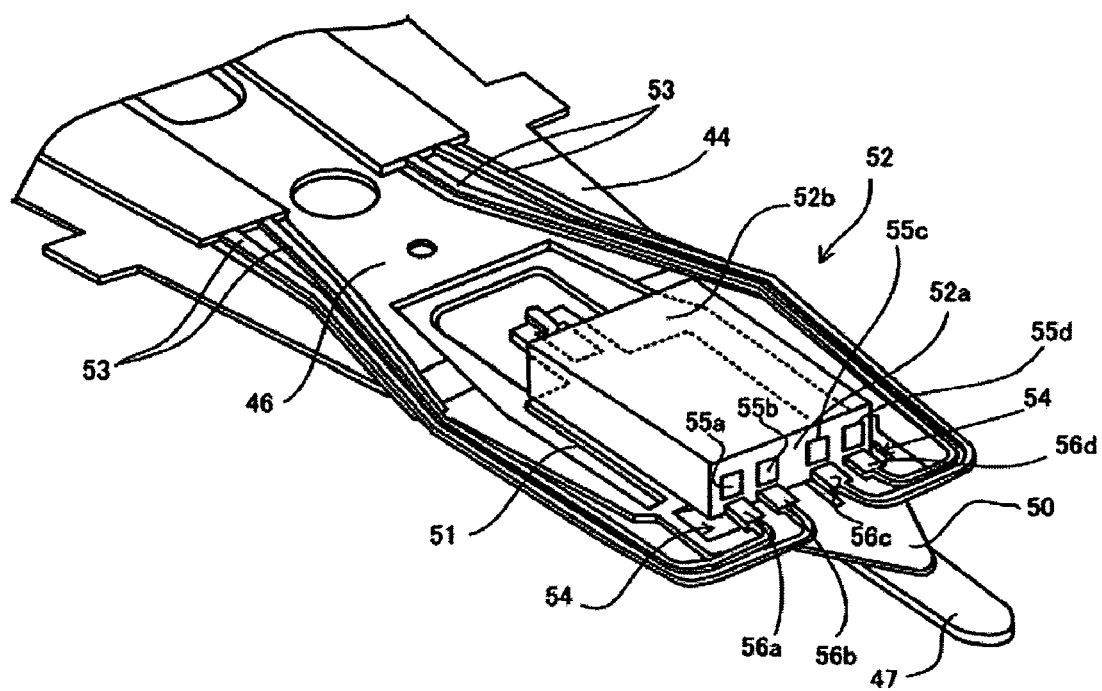
FIG. 3 is a partly enlarged view showing a head/slider portion of an HGA.

An exemplary embodiment of the present invention will be described with reference to the accompanying drawings. Throughout all accompanying drawings, like parts are identified by the same reference numerals. FIG. 1 is a plan view showing the construction of a magnetic disk drive. FIG. 2 is a perspective view showing a general construction of an HGA. FIG. 3 is a partly enlarged view showing a head/slider portion of the HGA shown in FIG. 2. Referring to FIG. 1, a magnetic disk drive 10 includes a magnetic disk 3, a head stack assembly 4, a flexible cable 5, and a terminal 6, all mounted on a base 2. The terminal 6 is for connecting the flexible cable 5 to an external circuit board. The magnetic disk 3 is screwed to a rotor portion of a spindle motor (not shown) disposed on the base 2, designed to be rotatably driven about a spindle shaft 7.

The head stack assembly 4 includes an HGA 41 and an actuator assembly 42. The HGA 41 is constructed as shown, for example, in FIGS. 2 and 3, as an integrated lead suspension that may include, as major components, a head/slider 52, a base plate 43, a load beam 44, a hinge 45, and a flexure 46. The base plate 43 is provided with an opening portion 43a. By making use of the opening portion 43a, a mount plate secured to a backside of the base plate 43 is swaged so that the HGA 41 may be secured to an actuator arm (not shown) of the actuator assembly 42. A structural body of the HGA 41 excluding the head/slider 52 is called a suspension assembly.

The integrated lead suspension may be classified into an additive type representing the exemplary embodiment of the present invention, a subtractive type, and an FPC type according to the manufacturing method employed. It should be noted that the present invention is applicable to any one of these three different types of integrated lead suspensions. Specifically, the additive type is manufactured by additively forming copper foil wiring and pads on the insulating material of the suspension. The subtractive type is manufactured by etching wiring and pads from copper foil formed as a sheet on the insulating material of the suspension. The FPC type is manufactured by bonding a flexible substrate (FPC) on which copper foil wiring and pads are formed, to the suspension.

The actuator assembly 42 includes an actuator arm for supporting the HGA 41, a portion for securing a pivot assembly functioning as a pivot 8, and a coil support (not shown) holding a voice coil (not shown). The actuator assembly 42 pivotally moves the HGA 41 about the pivot 8 in the direction of an arrow A or an arrow B. The voice coil and a yoke 9 constitute a voice coil motor (hereinafter referred to as VCM) with a voice coil magnet (not shown).

The hinge 45 has elasticity, connecting the base plate 43 to the load beam 44. The hinge 45 gives the load beam 44 pressing load so that the head/slider can properly fly above the magnetic disk. A lift tab 47 used for realizing a load/unload system with a ramp is formed on a leading end portion of the HGA 41. The flexure 46 holds a lead 49 that extends in a cranked shape from the leading end portion of the HGA 41 to a connector portion 48. The flexure 46 is spot-welded by a laser to the load beam 44 and the base plate 43. The lead 49 includes four conductors connecting a magnetic head formed in the head/slider 52 to the flexible cable 5. The number of conductors varies depending on the configuration of the magnetic head.

The flexure 46 is secured to the load beam 44 so that a flexure tongue 51 secured to the head/slider 52 can make pivotal movement or gimbal movement. Referring to FIG. 3, a flexure tongue 51 is formed so as to protrude toward a center of an opening portion from a platform 50 on a leading end portion of the flexure 46. A fixing surface of the head/slider 52 is bonded to the flexure tongue 51 using an adhesive with an ABS 52b facing up. Adhesion of the adhesive is adequately selected. If it is found, as a result of a functional test, that the head/slider 52 requires replacement, the adhesive allows the head/slider 52 to be removed from the flexure tongue 51.

The flexure tongue 51 is supported by a dimple (not shown) protruding from the load beam 44 at a position corresponding to a central portion of the slider 52. Because of this construction, the head/slider 52 is capable of following tracks by making flexible pivotal movement in a pitch direction and a roll direction relative to the load beam 44 when flying by receiving an air stream on the surface of the magnetic disk.

Slider pads 55a, 55b connected to a read head and slider pads 55c, 55d connected to a write head are formed on a side surface 52a on a trailing edge of the head/slider 52. The number of slider pads is not limited to four. There has lately been devised a head/slider that is designed to adjust a flying height by heating an area near a write head with a heater for controlling thermal protrusion occurring in the write head.

In this case, the head/slider includes six pads representing the pads connected to the heater in addition to the slider pads connected to the read head and write head. The head/slider according to the present invention may include any number of slider pads. The slider pads 55a, 55b, 55c, 55d are formed by applying gold plating to a copper seed layer. The copper seed layer is connected to the read head or the write head through an electrode stud formed inside the slider.

An area between the platform 50 and the flexure tongue 51 that serves as a soldering connection point between the slider pads 55a, 55b, 55c, 55d and lead pads 56a, 56b, 56c, 56d corresponding thereto, respectively, is provided with an opening portion 54. The lead 49 shown in FIG. 2 is divided into two pairs of lead wires 53 at an area where the lead wires 53 come out of a protective sheet as shown in FIG. 3. The two pairs of lead wires 53 are routed toward a leading end portion of the HGA 41. The lead wires 53 are then bent substantially at right angles at side surface portions of the opening portion 54 disposed at a leading end portion of the flexure 46 in an aerial condition, reaching the platform 50. Further, each of the lead wires 53 is bent on the platform 50 a second time substantially at right angles toward the four slider pads 55a, 55b, 55c, 55d formed on the side surface 52a on the trailing end of the head/slider 52.

An end of each of the bent lead wires 53 is formed with a corresponding one of the lead pads 56a, 56b, 56c, 56d to be connected to the slider pads 55a, 55b, 55c, 55d, respectively. An intersection point between a surface extended from a connection surface of the slider pad and a surface extended from a connection surface of the lead pad is formed at right angles. The present invention is not, however, limited to a case in which the surface extended from the connection surface of the slider pad and the surface extended from the connection surface of the lead pad are orthogonal to each other. Rather, it is appropriate that the connection surface of the slider pad faces the connection surface of the lead pad at a predetermined angle other than a right angle. The head/slider 52 is fixed to the flexure tongue 51 with an adhesive after the suspension assembly has been formed. It is therefore necessary that the lead pads and the slider pads be connected electrically to each other. The lead pads and the slider pads are connected to each other through a method using a soldering iron or ultrasonic bonding. The present embodiment of the present invention employs the solder ball connection technique using laser beam irradiation.

The method of connecting the slider pads and the lead pads through the solder ball connection technique will be described. The two pads are generally connected as below. That is, the HGA 41 is first supported using a jig such that the right angle formed at the intersection point between the surface extended from the connection surface of the slider pad and the surface extended from the connection surface of the lead pad faces upward in a vertical direction. A solder ball is then temporarily placed between the two pads. The solder ball is next irradiated with a laser beam so as to connect the two pads together.

Figure 4:
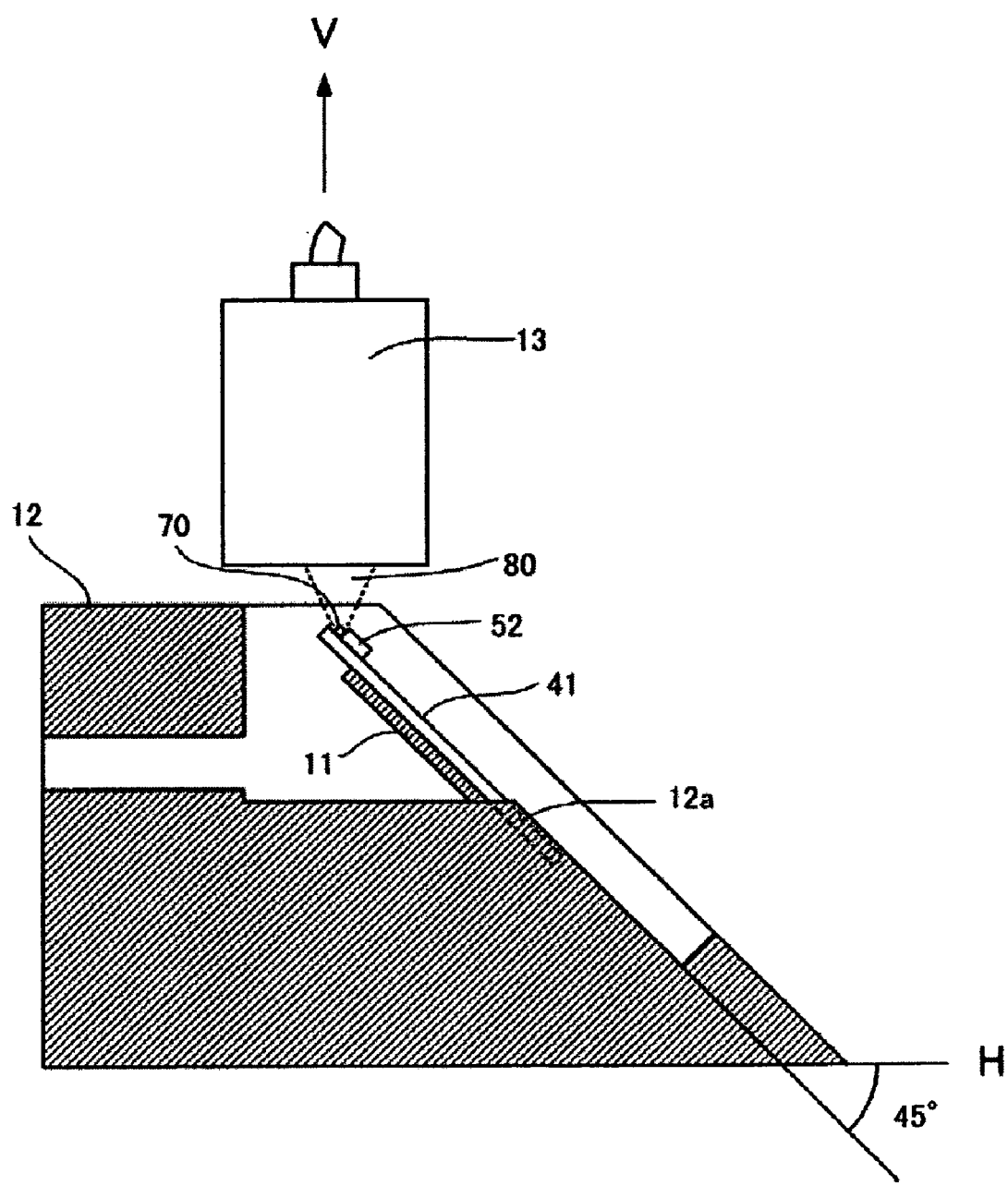
FIG. 4 is a cross sectional view showing a solder ball connection apparatus.
Figure 5:
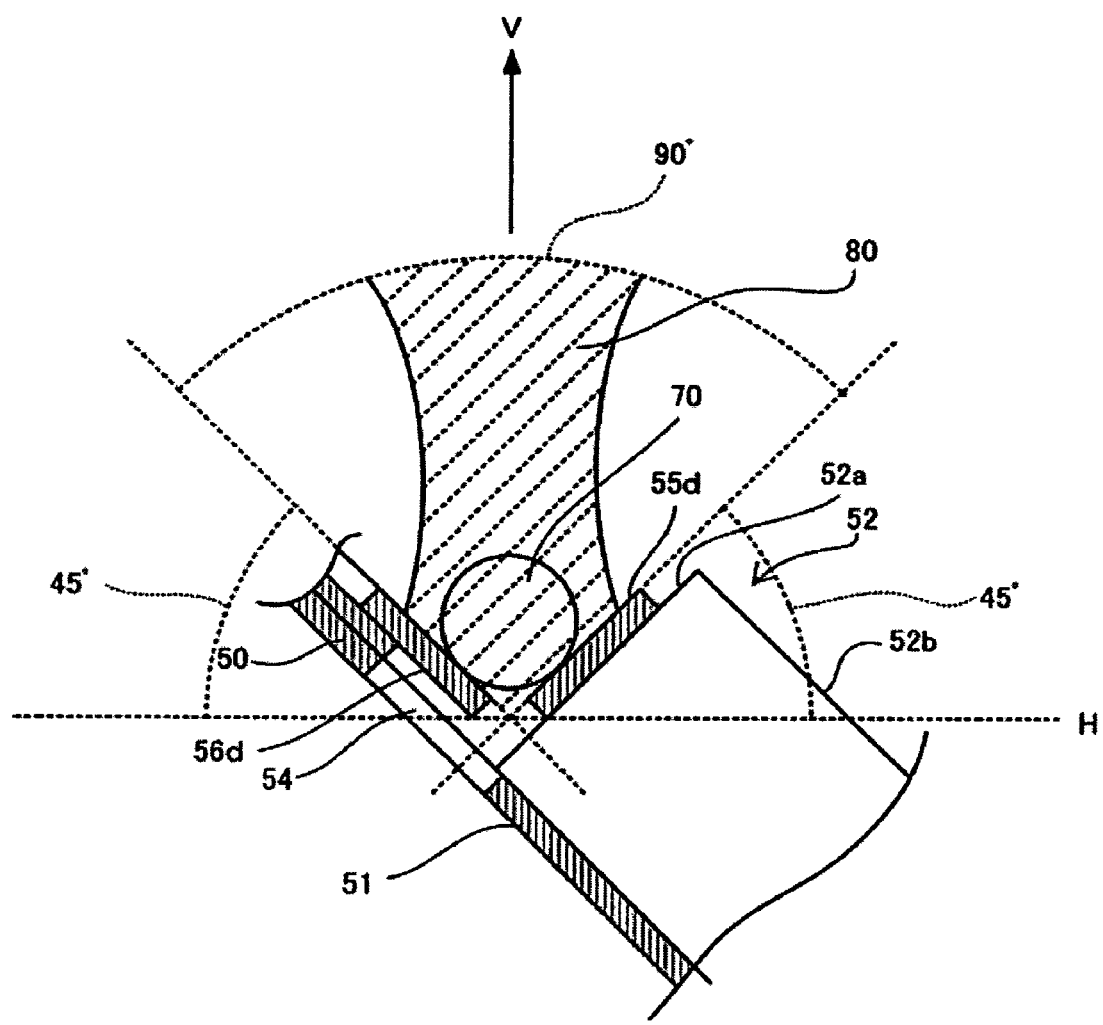
FIG. 5 is an enlarged cross sectional view showing a state where a solder ball is temporarily deposited on an HGA held in position by a working jig.

The method for supporting the HGA 41 such that the right angle portion formed between the connection surface of the slider pad and the connection surface of the lead pad faces upward in the vertical direction will be described. FIG. 4 is a cross sectional view showing a solder ball connection apparatus for connecting the two pads by irradiating a solder ball 70 disposed therebetween with a laser beam. FIG. 5 is an enlarged cross sectional view showing a state in which the solder ball 70 is temporarily deposited on the HGA 41 held in position by a working jig 11 shown in FIG. 4. FIG. 4 shows an optical (laser) system 13 for irradiating the solder ball 70 with a laser beam 80, the working jig 11 for holding the HGA 41, and a placement base 12 for holding the working jig 11.

The placement base 12 includes a placement surface 12a having an inclination of 45 degrees with respect to a horizontal plane H. Likewise, the working jig 11 is disposed on the placement surface 12a so as to be inclined at 45 degrees relative to the horizontal plane. Further, the HGA 41 is held in position on the working jig 11 with the head/slider 52 positioned upwardly and the ABS 52b of the head/slider 52 facing up. At this time, the HGA 41 is held by the working jig 11 in a position as detailed in the following. Specifically, the connection surface of the slider pads 55a, 55b, 55c, 55d and the connection surface of the lead pads 56a, 56b, 56c, 56d opposing thereto at the leading end portion of the HGA 41 maintain an angle of about 45 degrees relative to the horizontal plane. That is, the HGA 41 is supported on the working jig 11 such that a V-structure of a virtual right angle portion formed between the connection surface of the slider pads and the connection surface of the lead pads faces and opens upwardly in the vertical direction.

The solder ball 70 is then temporarily placed between the two pads and is thereafter irradiated with the laser beam 80. The method for disposing the solder ball 70 between the two pads and irradiating the solder ball 70 with the laser beam 80 is disclosed in detail in Japanese Patent Laid-open Nos. 2002-25025 and 2002-251705. The method for disposing the solder ball 70, the construction of the optical system 1310, and the like, which are not directly relevant to the present invention, will be only briefly described.

The optical system 13 is a fiber laser terminating module using an optical fiber for a resonator. The optical system 13 has a series of optics lenses disposed along an optical path therein to form a hollow laser beam path space. The optics lenses converge diverging light outputted from the optical fiber to form the laser beam 80, which, in turn, is outputted from a leading end portion of the optical system 13. The slider pad 55d and the lead pad 56d are each disposed so as to rise 45 degrees from the horizontal plane. The surface extended from the connection surface of the slider pad 55d and the surface extended from the connection surface of the lead pad 56d are orthogonal to each other to form a virtual right angle therebetween. The virtual right angle portion opens upwardly in the vertical direction such that the portion can receive the solder ball 70 supplied by being dropped from a solder ball transfer system.

The solder ball 70 is temporarily placed on, and in contact with, each of the connection surface of the slider pad 55d and the connection surface of the lead pad 56d and comes to a standstill. At that time, the optical system 13 is moved by a moving mechanism (not shown) to an irradiation position. The optical system 13 thereby irradiates the solder ball 70 with the laser beam 80 that has been converged to a predetermined spot diameter. A predetermined amount of nitrogen gas $N_2$ is injected through a nitrogen gas introduction pipe (not shown) of the placement base 12 for making an inert atmosphere for suppressing oxidation of the solder. The injection of the nitrogen gas $N_2$ occurs at timing during the period of time that begins when the solder ball 70 is temporarily deposited and ends when the laser beam 80 is emitted. The slider pad 55d, the lead pad 56d, and the solder ball 70 are thus placed in the inert atmosphere. The injection position and flow velocity of the nitrogen gas $N_2$ are taken into consideration to ensure that the solder ball 70 remains stationary even with an air pressure occurring during injection. Despite the consideration, if the slider pad 55d or the lead pad 56d has a poor surface condition, or the posture of the HGA 41 held in the placement base 12 is not adequate, the solder ball 70 can at times be moved during injection of the nitrogen gas.

While the inert atmosphere state is maintained, the optical system 13 emits the laser beam 80 to heat and melt the solder ball 70, thereby connecting the slider pad 55d and the lead pad 56d. The spot diameter of the laser beam 80 at this time is set to about 150 to 200 μm if the solder ball 70 has an outside diameter of, for example, about 120 μm. The solder ball 70 having an outside diameter of 80 μm, 110 μm, or 130 μm is usually used. According to the present embodiment of the present invention, however, the solder ball having an outside diameter of 130 μm is used.

Figure 6:
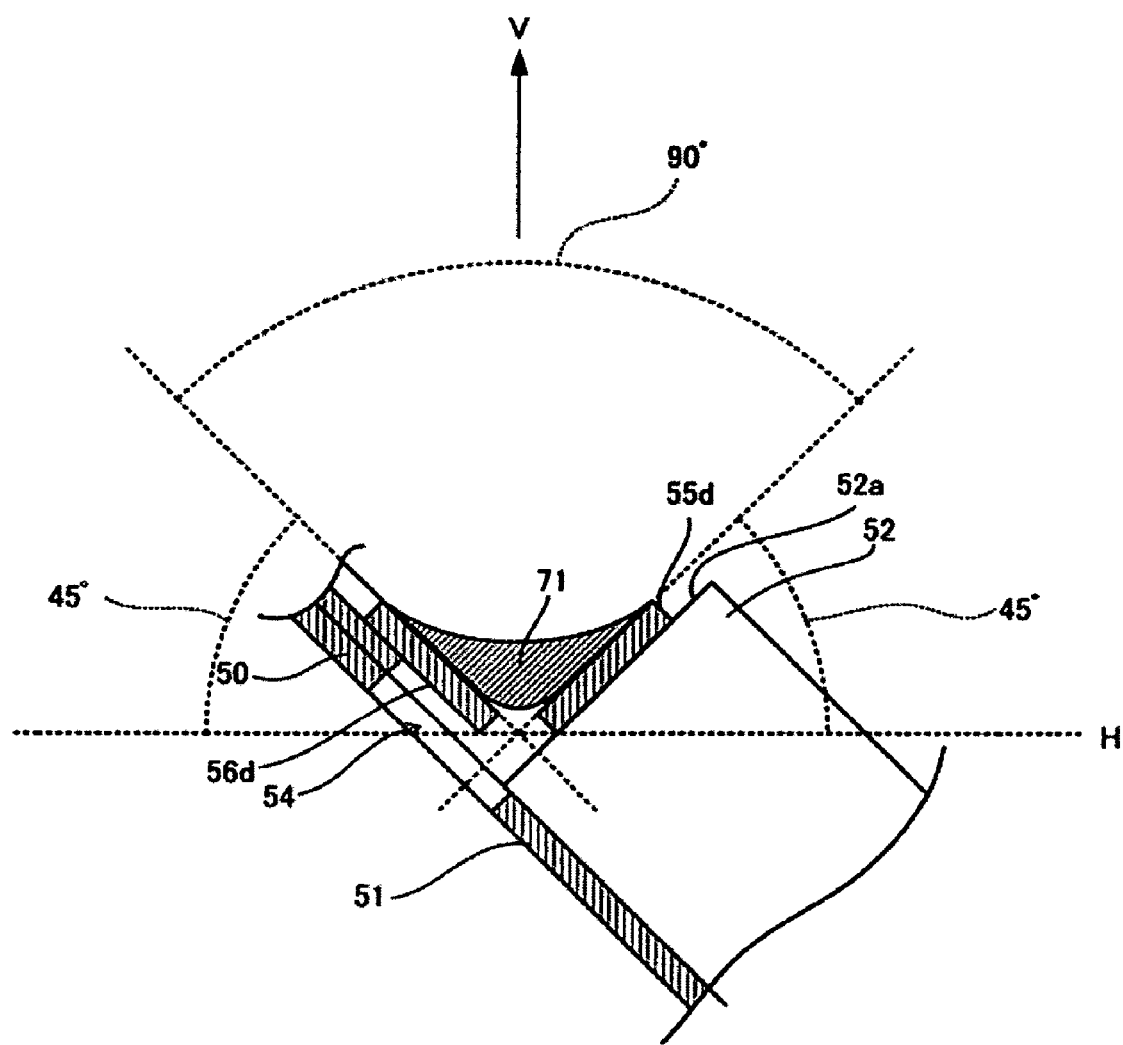
FIG. 6 is a side elevational view showing a state where a solder fillet is formed through laser beam irradiation.

The solder melted in the inert atmosphere of the nitrogen gas $N_2$ joins the two pads together. When the solder is thereafter cooled to form a solder fillet, the inert nitrogen gas $N_2$ serves to cover the surface of the solder, which prevents the solder from being oxidized. FIG. 6 is an enlarged cross sectional view showing a state in which the solder ball 70 of FIG. 5 is melted to make a solder fillet 71 to connect the slider pad 55d with the lead pad 56d.

The molten solder ball 70 spreads all over the connection surfaces of the slider pad 55d and the lead pad 56d. When laser beam irradiation is thereafter interrupted, the solder ball 70 cools down and solidifies, thus forming the solder fillet 71 of an inverted arch connecting the two pads as shown in FIG. 67. With the solder ball connection technique, various types of subtle parameters should be appropriately set to form a good solder fillet for making the soldered connection. The parameters include: energy intensity of the laser beam; position of the solder ball relative to the slider pad and the lead pad; solder wettability of the connection surfaces of the slider pad and the lead pad; and positional relation between the slider pad and the lead pad.

Figure 7:
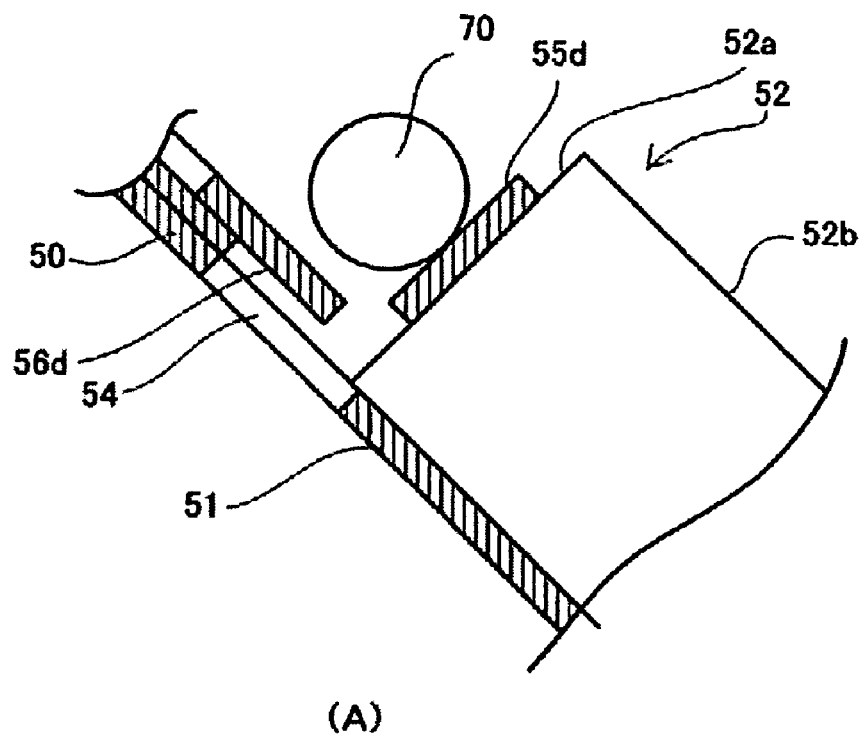
FIGS. 7a and 7b include side elevational views for illustrating typical forms of failure in forming a solder fillet through laser beam irradiation.
Figure 7:
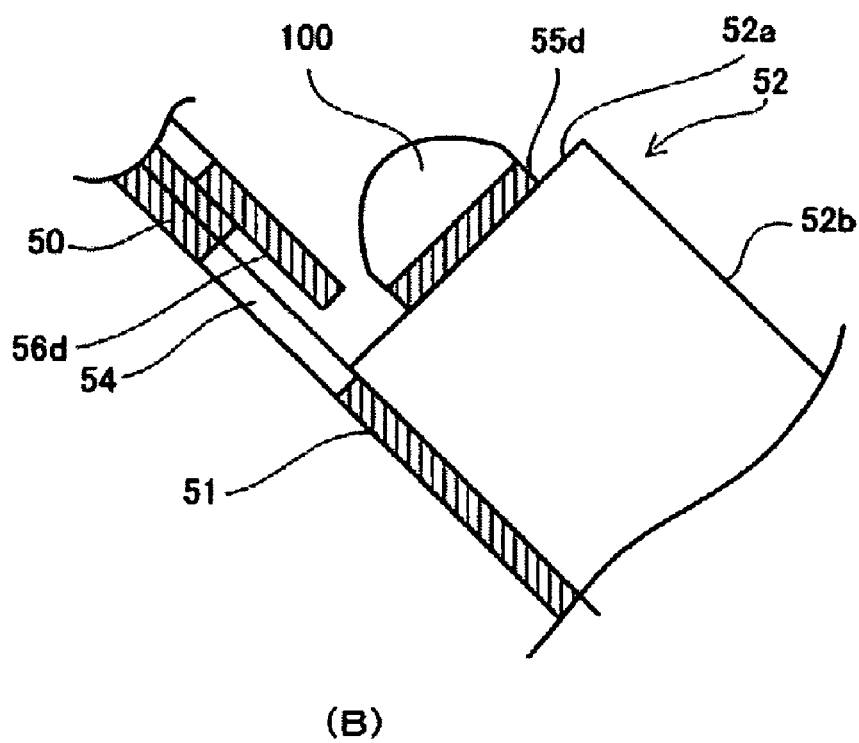

FIG. 7 includes views for illustrating a typical form of connection failure occurring in the soldered connection made using the solder ball connection technique. FIG. 7(A) shows a state in which the solder ball 70 does contact the connection surface of the slider pad 55d, but not the connection surface of the lead pad 56d. Such a state can occur if the solder ball supplied from the solder ball transfer system is charged with static electricity, the connection surface of the slider pad 55*d* or the lead pad 56*d* is not flat, or nitrogen gas is supplied inadequately. If the solder ball 70 in a state as shown in FIG. 7(A) is irradiated with the laser beam, the molten solder is unable to spread over the connection surface of the lead pad 56*d*. As a result, the whole solder ball is deposited on the slider pad 55*d* to become a solder mass 100 of a dome shape as shown in FIG. 7(B).

The dome-shaped solder mass 100, not being connected to the lead pad 56*d*, causes connection failure to occur between the lead pad 56*d* and the slider pad 55*d*. Irradiating the solder mass 100 in the state as shown in FIG. 7(B) with the laser beam does not make the solder spread on to the connection surface of the lead pad 56*d*, and thus is unable to form a solder fillet across the slider pad and the lead pad. It has therefore been conventional practice to discard the entire HGA 41. According to the present invention, however, if the solder ball connection technique fails to form a good solder fillet as described above, the solder mass is subjected to a reflow process by irradiating the solder mass with a laser beam a second time, thereby allowing a good solder fillet to be formed across the two pads. The present invention thus allows the HGA 41 to be reused without discarding the HGA 41.

Figure 8:
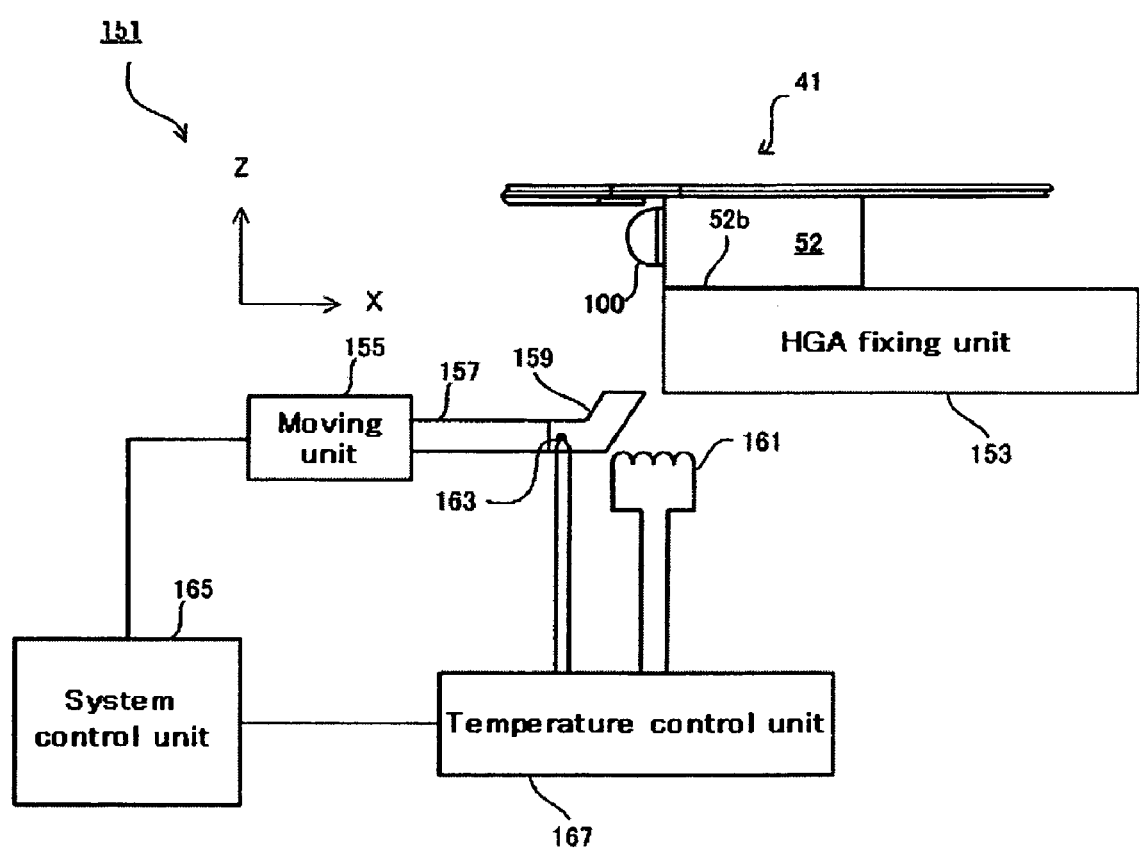
FIG. 8 is a block diagram showing schematically a solder mass shaping system according to an embodiment of the invention.

FIG. 8 is a block diagram showing schematically a solder mass shaping system 151 used for making a soldered connection between the lead pad and the slider pad by subjecting the solder mass deposited on the slider pad to the reflow process. The solder mass shaping system 151 adequately shapes the solder mass 100 in advance so that a solder fillet for connecting the slider pad and the lead pad can be formed by irradiating the solder mass 100 with the laser beam. The solder mass 100 is lead-free solder including Sn (85 to 95 wt %), Ag (1 to 3 wt %), Bi (1 to 5 wt %), and Cu (1 wt % or less), having a melting point at 210° C. to 216° C. The composition ratio is given by weight percentage.

An HGA fixing unit 153 secures the HGA 41 in position so that the ABS 52*b* of the head/slider 52 faces down. A moving unit 155 holds a shaping tool 157 and is capable of moving in X direction, Y direction, and Z direction relative to the HGA fixing unit 153. The X direction and Z direction are as shown in FIG. 8, while the Y direction is perpendicular to the X direction and Z direction. A shaping tip 159 is fitted at a leading end of the shaping tool 157. An electric heater 161 is disposed near the shaping tip 159 for heating the shaping tip 159.

The heater 161 moves integrally with the shaping tool 157. The heater 161 may be embedded in the shaping tip 159 or the shaping tool 157. A temperature sensor 163 including a thermistor or a thermocouple is embedded inside the shaping tip 159. The temperature sensor 163 functions to detect a surface temperature of the shaping tip 159.

A temperature control unit 167 controls current that is allowed to flow through the heater 161 by receiving from a system control unit 165 a signal corresponding to the melting point of the solder ball 70 or the solder mass 100 that represents the solder ball 70 melted down. When the melting point of the solder mass 100 involved with shaping is set in the system control unit 165, the temperature control unit 167 controls the heater current so as to bring the surface temperature of the shaping tip 159 to a value that does not exceed the melting point of the solder mass 100 and that is as close to the melting point as possible.

A temperature table is created in advance in order to maintain the temperature of the shaping tip 159 at a predetermined value using temperature setting made in the system control unit 165. The temperature table associates the temperatures set in the system control unit 165 with readings of the temperature sensor 163 and actual surface temperatures of the shaping tip 159. The temperature table is created by measuring the surface temperature of the shaping tip 159 using another thermometer, thereby experimentally obtaining the relationship among these parameters. The temperature table is provided in the temperature control unit 167. Receiving the signal for temperature setting from the system control unit 165, the temperature control unit 167 controls the current allowed to flow through the heater 161 so as to maintain the surface temperature of the shaping tip 159 at the predetermined value, while referring to the temperature table based on the reading taken by the temperature sensor 163.

The solder mass shaping system 151 according to the embodiment of the present invention is designed to control the surface temperature of the shaping tip 159 at (K−10° C.) ±10° C. during shaping of the solder mass once the melting point K° C. is set in the system control unit 165. That is, the shaping tip 159 is heated to a temperature span ranging from the melting point of the lead-free solder to a value equivalent to the melting point less 20° C. Accordingly, the shaping tip 159 can soften the solder mass 100 to a degree that can easily shape the solder mass 100, while ensuring that the solder mass 100 is not melted during shaping.

The temperature sensor 163 monitors the surface temperature of the shaping tip 159 while the shaping tip 159 is shaping the solder mass 100. If any faulty temperature is detected, a signal is outputted from the temperature control unit 167 to the system control unit 165 to interrupt the shaping operation. If the surface temperature of the shaping tip 159 becomes higher than the melting point of the solder mass 100, the solder mass 100 melts to create a short circuit across slider pads. Solder droplets could also scatter around, thus adversely affecting quality of the HGA 41. Further, if the shaping tip 159 becomes inordinately hot, heat from the shaping tip 159 could be transferred to a sensitive head, leading to degraded performance.

The slider pad is a small conductive area formed on the surface of the slider and has weak mechanical strength. The slider pad can be damaged during shaping of the solder mass 100 unless care is taken to minimize stress applied to the slider pad as much as possible. If the temperature of the shaping tip 159 is excessively low, the solder mass 100 cannot be softened sufficiently. When the moving unit 155 moves in the Z direction to cause the shaping tip 159 to shape the solder mass 100, an excessive force can at times be applied to the slider pad, thus damaging the slider pad. It should be particularly noted that the lead-free solder is harder than the leaded solder at low temperatures. Accordingly, it is necessary to soften the lead-free solder with an increased temperature before starting the shaping operation.

An approach may be possible in which the solidified solder mass 100 is softened by placing the head/slider in a reflow oven. It is, however, unpreferable to place the head/slider in the reflow oven, since placing the head/slider in the reflow oven allows heat to be applied also to the head, which can damage the head. In particular, the lead-free solder has a high melting point. Accordingly, there is even a greater likelihood that the head will be damaged even if the reflow oven is only set to a temperature near the melting point. Adopting a method of applying heat to the solder locally using a laser beam in order to soften the solder mass 100 is not easily implemented, since it is difficult to control energy of the laser beam.

Narrowing the spot diameter of the laser beam results in energy becoming excessively intense. This allows the surface of the solder to start melting, causing droplets of molten solder to be deposited on the surface of the slider or a circuit across slider pads to be shorted. Widening the spot diameter to make the energy less intense allows the laser beam to affect also a solder fillet that has been formed properly. To realize the present invention, therefore, it is effective to heat and soften the solder mass 100 through the use of the shaping tip 159 as in the solder mass shaping system 151.

The system control unit 165 controls operations of the solder mass shaping system 151 overall. The system control unit 165 controls movement of the moving unit 155 so that the shaping tip 159 can move to a position previously defined in the X direction, Y direction, and Z direction. On receipt of a signal indicating that the temperature conditions for the shaping tip 159 are met from the temperature control unit 167, the system control unit 165 authorizes the moving unit 155 to start the shaping operation. On receipt of a signal representing a faulty temperature detected by the temperature sensor 163 from the temperature control unit 167 during the shaping operation, the system control unit 165 transmits a stop signal to the moving unit 155 to interrupt the shaping operation.

Figure 9:
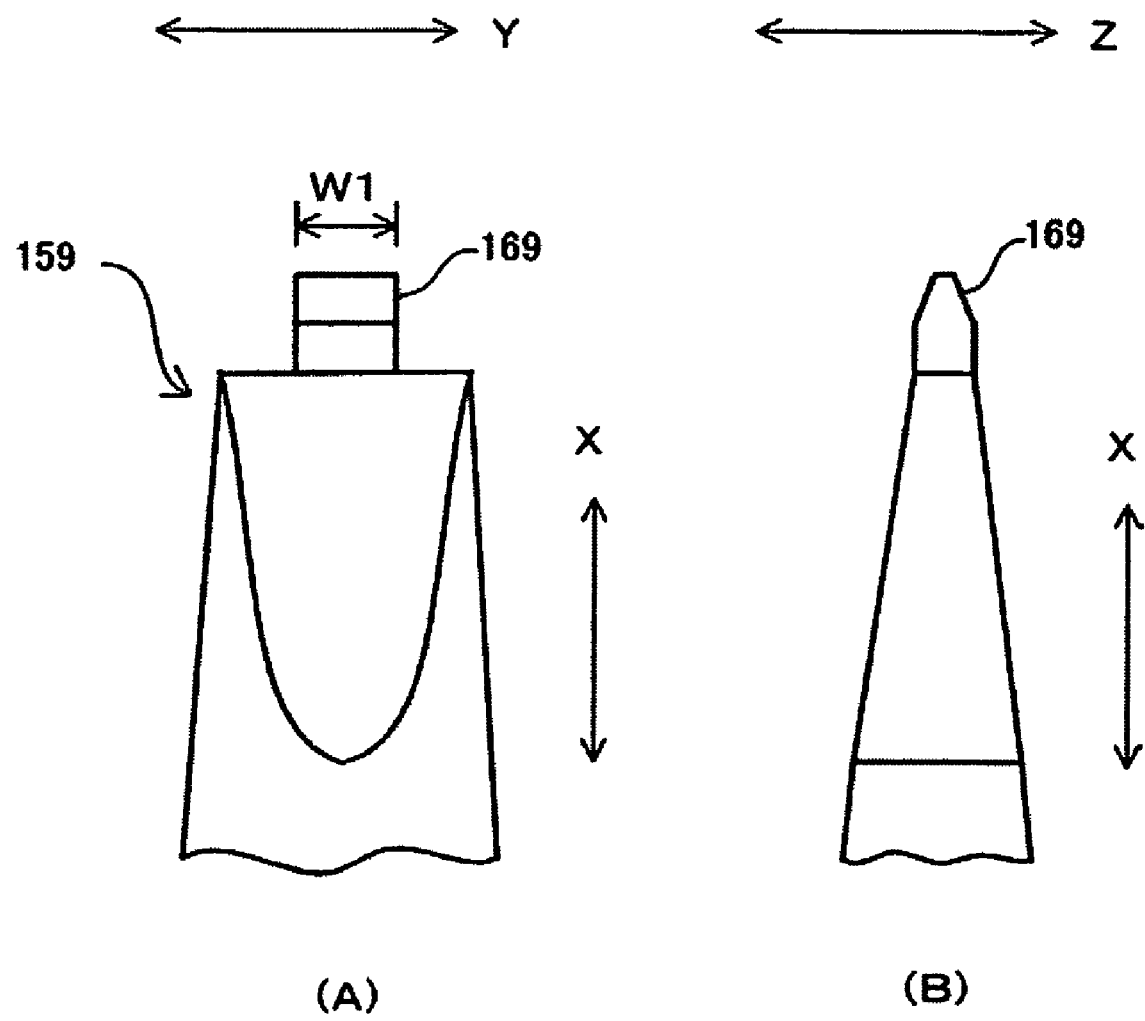
FIGS. 9a and 9b include views showing outlines of a shaping tip used in a solder mass shaping system.

FIG. 9 shows outlines of the shaping tip 159 mounted at the leading end of the shaping tool 157. FIG. 9(A) is a view as viewed from the Z direction in FIG. 8. FIG. 9(B) is a view as viewed from the Y direction in FIG. 8. The shaping tool 157 mounted on the moving unit 155 moves in the X direction, Y direction, and Z direction shown in FIGS. 9(A) and 9(B). A cutter having a width W1 is formed on a leading end portion 169 of the shaping tip 159. The shaping tip 159 is formed to a size that allows the solder mass 100 deposited on any given slider pad to be shaped. According to the embodiment of the present invention, W1 is about 120 μm.

Figure 10:
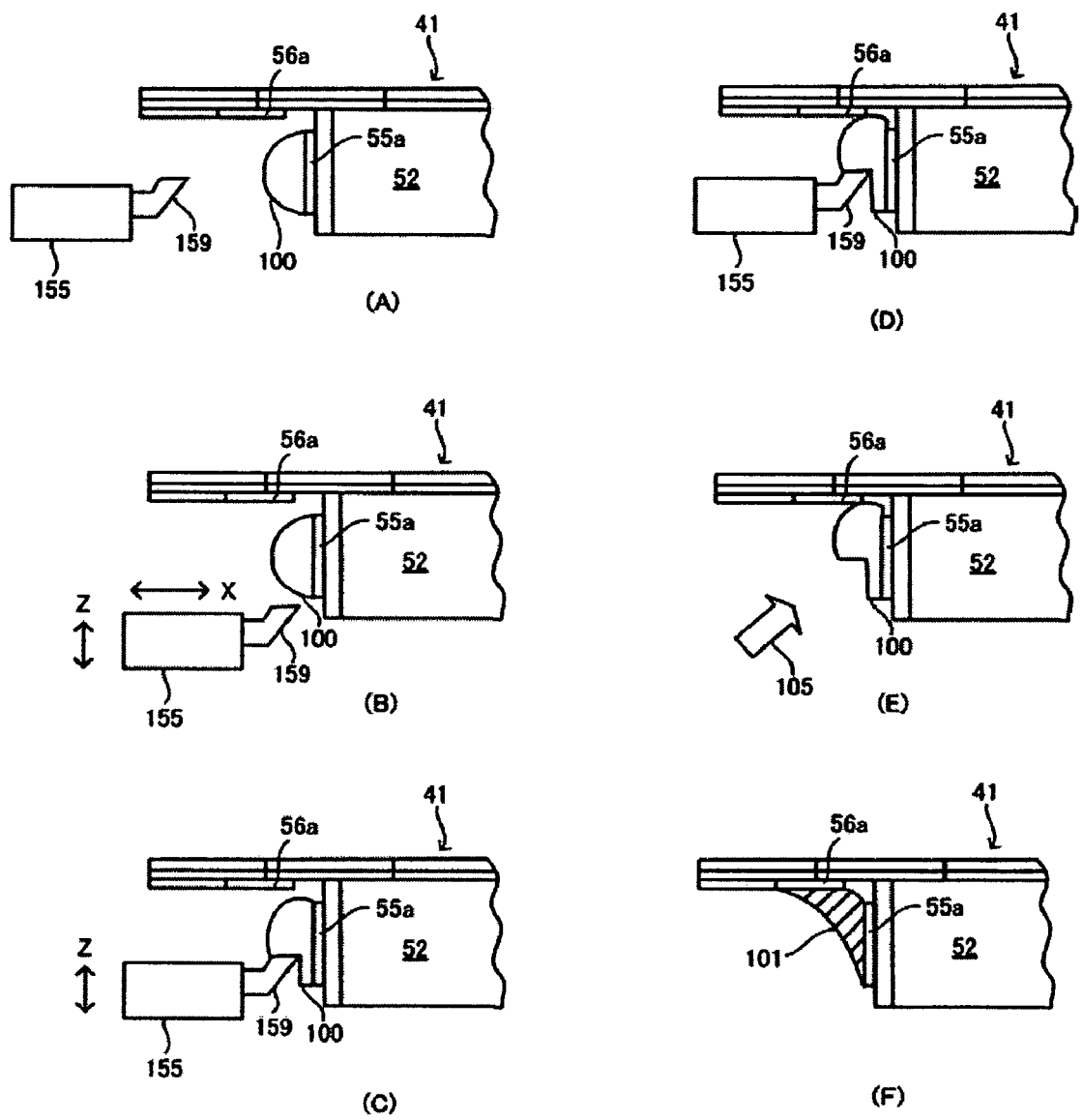
FIGS. 10(A) through 10(F) are views for illustrating steps for making a soldered connection between a lead pad and a slider pad by reflowing a solder mass.

Steps for manufacturing the HGA by shaping and reflowing the solder mass 100 shown in FIG. 7(B) with a laser beam to form a solder fillet will be described with reference to FIGS. 10 through 13. FIG. 10 show states of the solder mass during steps from shaping and reflowing the solder mass 100 deposited on the slider pad 55a of the HGA 41 to making a soldered connection between the lead pad 56a and the slider pad 55a with a solder fillet 101. FIG. 13 is a flowchart showing steps for manufacturing the HGA by forming the solder fillet.

In block 201, the HGA 41 is formed by mounting the head/slider to the suspension assembly and soldered connections are made by irradiating each of a plurality of solder balls disposed between a plurality of lead pads and a plurality of slider pads, each having a connection surface opposing at right angles with a corresponding one, with a laser beam. Conditions of the soldered connections are then visually checked. As a result of the visual check, it is found that a solder fillet is not formed between the lead pad 56a and the slider pad 55a and the solder fillet 100 as shown in FIG. 7(B) or 10(A) is deposited on the slider pad 55a. The solder fillet 100 is deposited only on the slider pad 55a, not on the lead pad 56a.

In block 203, the HGA 41 is fixed to the HGA fixing unit 153 of the solder mass shaping system 151 with the ABS 52b facing down. The system control unit 165 is provided with the model code of the HGA 41, the number assigned to the specific slider pad, to which the solder mass 100 is deposited as a result of failure in forming a solder fillet, and the melting point of the solder. Given the model code of the HGA 41, the size of the HGA 41, the outline of the solder ball, and the like are defined, allowing an internal processor of the system control unit 165 to calculate control variables of the moving unit 155.

Figure 11:
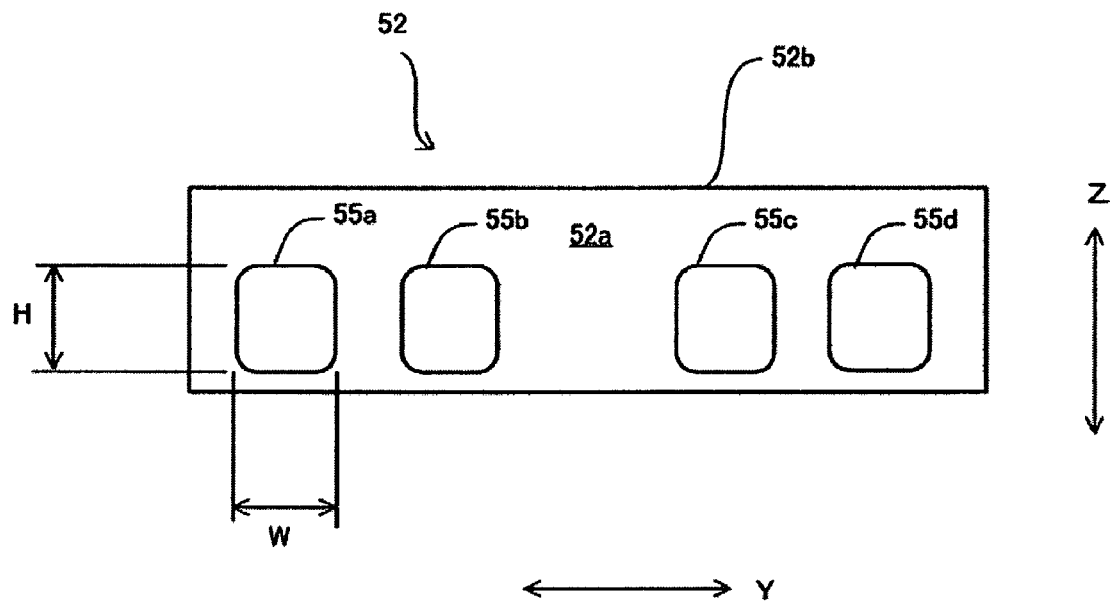
FIG. 11 is a front view showing a surface of a head/slider, on which slider pads are formed.

In block 205, when the temperature sensor 163 detects that the surface temperature of the shaping tip 159 has risen to an appropriate level as a result of heating of the shaping tip 159 by the heater 161, the system control unit 165 moves the moving unit 155 in the X direction, Y direction, and Z direction for initial positioning, making the system ready for the shaping operation. FIG. 11 shows the side surface 52a on the trailing edge on which the slider pads 55a, 55b, 55c, 55d of the head/slider 52 are formed. The solder connection surface of each of the slider pads 55a, 55b, 55c, 55d is formed into a rectangle measuring about 145 μm in width W and about 138 μm in height H.

If, for example, number 1 is defined in the system control unit 165 as the number assigned to the slider pad 55a on which the solder mass 100 is deposited, the moving unit 155 moves in the Y direction and stops at a position corresponding to the slider pad 55a. The moving unit 155 then moves in the X direction and stops at a position, at which the leading end of the shaping tip 159 is spaced a distance H1 from the surface of the slider pad 55a.

Figure 12:
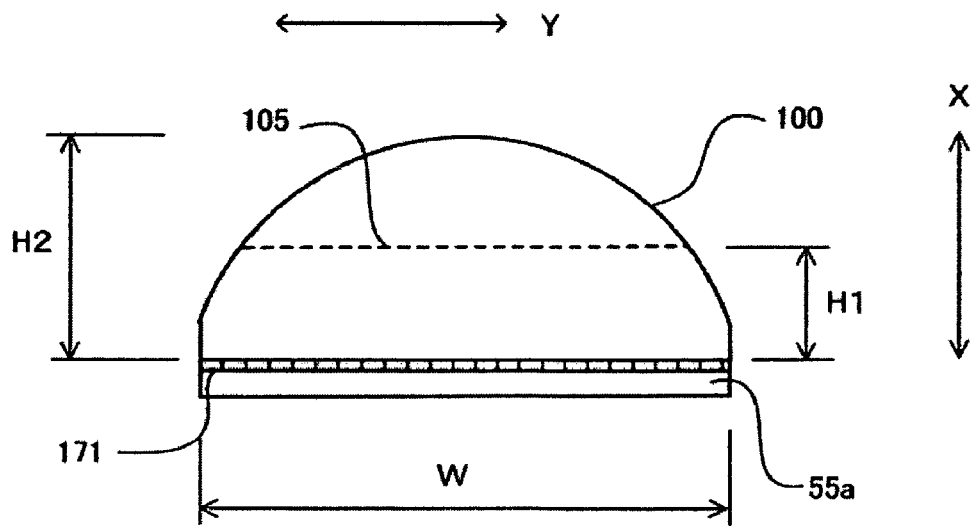
FIG. 12 is a view for illustrating the position, at which a solder mass is shaped using a shaping tool.
Figure 13:
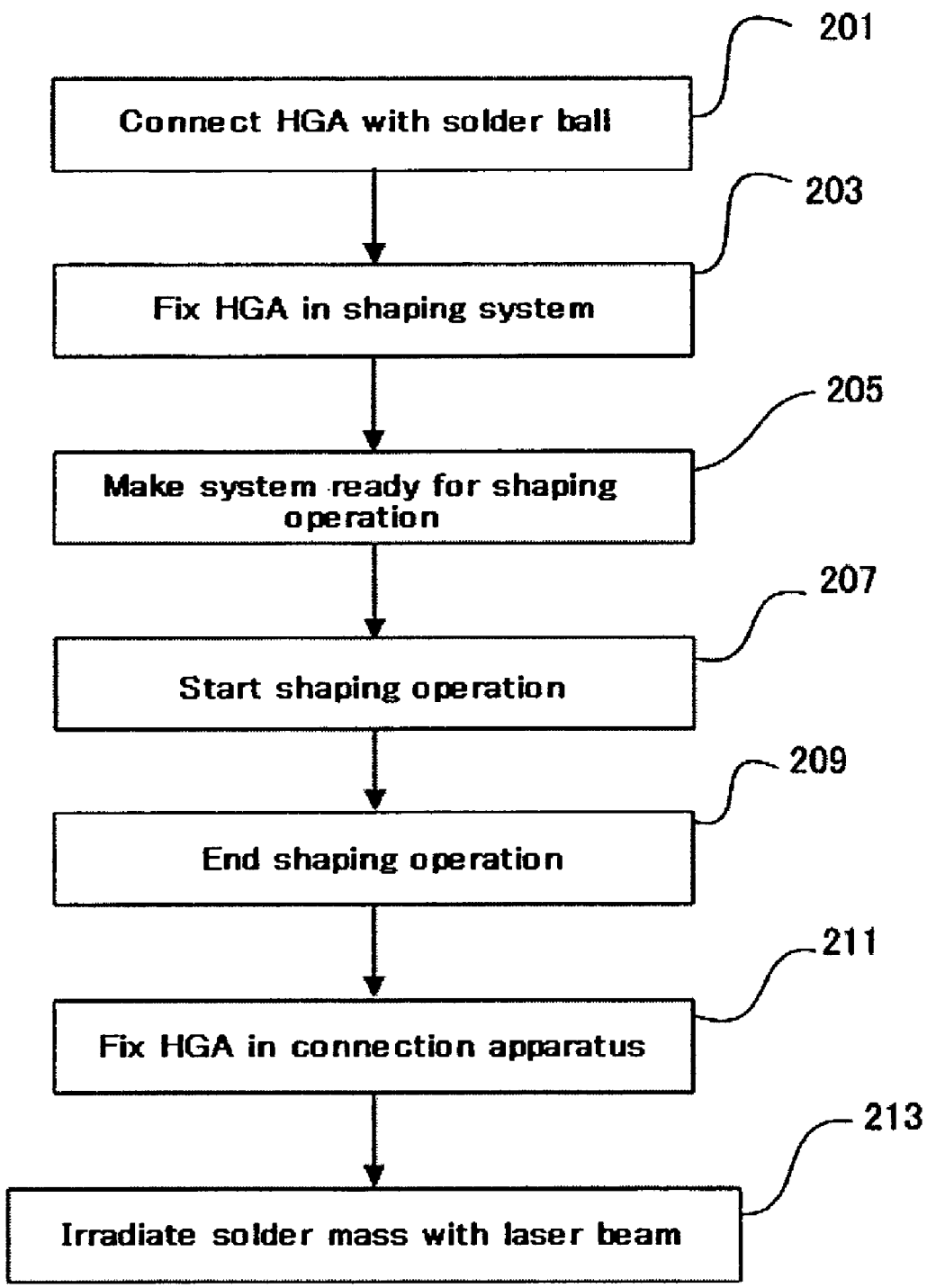
FIG. 13 is a flowchart showing steps for manufacturing an HGA by reflowing a solder mass to make a soldered connection between a lead pad and a slider pad according to an embodiment of the invention.
Figure 14:
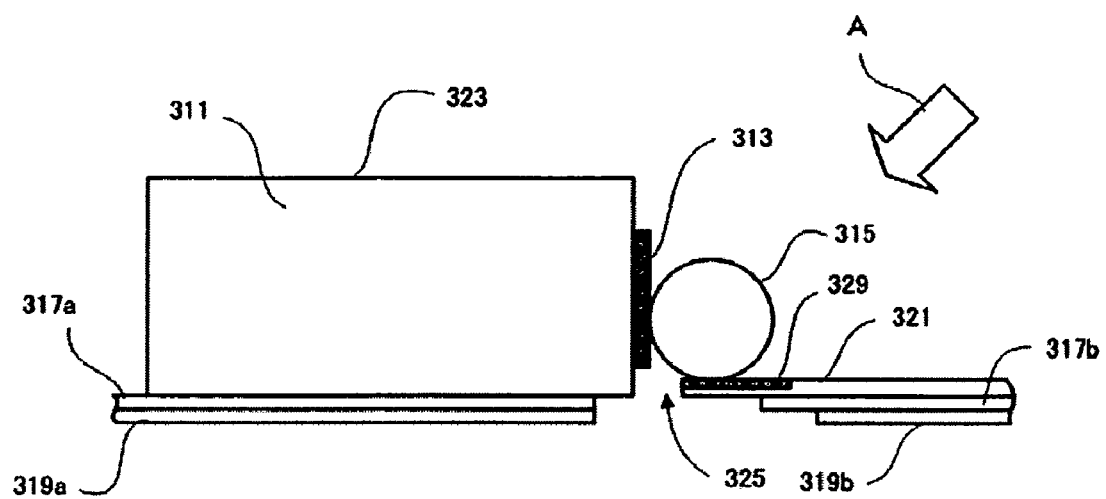
FIGS. 14a and 14b include views for illustrating a solder ball connection technique.
Figure 14:
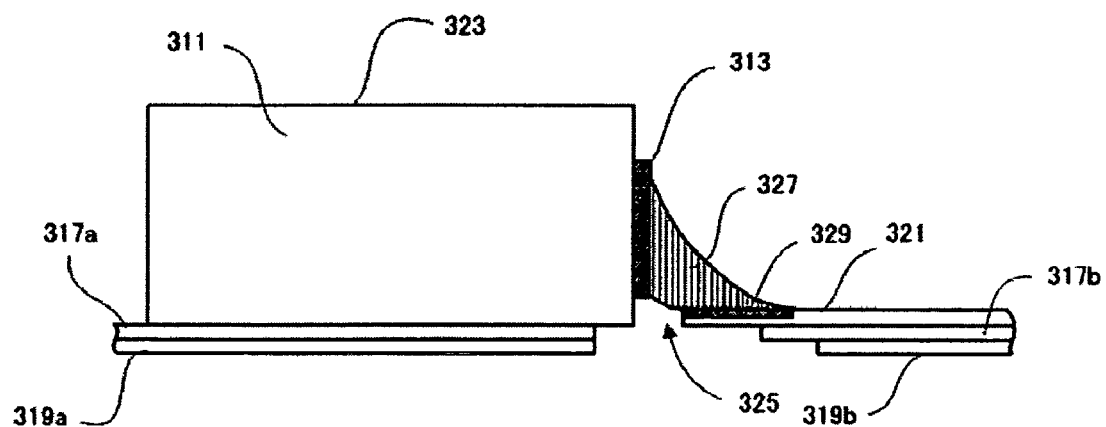

FIG. 12 is a view showing the position of a cutting edge of the leading end portion 169 of the shaping tip 159 set relative to the solder mass 100 deposited on the slider pad 55a. The solder mass 100 is deposited on the connection surface of the slider pad 55a so as to form a dome shape. A height H2 of the solder mass 100 up to a vertex is about 80 μm. In the state in which the solder mass 100 is shaped on the connection surface of the slider pad 55a, heat during reflowing causes a surface portion 171 of the slider pad 55a to transform to a layer of an alloy of solder and gold or an intermetallic compound layer. If, for example, Sn—Ag-based lead-free solder is used, an alloy layer 171 of tin, silver, and gold is formed. The position of the cutting edge of the leading end portion 169 of the shaping tip 159 is set on a line 105 that is spaced a distance H1 from the surface of the alloy layer 171. According to the embodiment of the present invention, the distance H1 is about 30 μm and the alloy layer is about 3 μm thick. The system control unit 165 moves the moving unit 155 such that the shaping tip 159 is positioned in the X direction and Y direction as described above. In the Z direction, the shaping tip 159 is moved to a position where the shaping tip 159 does not come into contact with the solder mass 100.

When initial positioning of the shaping tip 159 is completed as shown in FIG. 10(B), the system control unit 165 moves the moving unit 155 in the Z direction to allow the moving unit 155 to approach the HGA 41 in block 207. This results in the shaping tip 159 starting to shape the solder mass 100. Referring to FIG. 10(C), the shaping tip 159 heats and softens the solder mass 100. The cutting edge of the leading end portion 169 moves only an upper portion of the solder mass 100 above the line 105 toward the lead pad 56a, leaving a lower portion below the line 105 behind on the connection surface of the slider pad 55a. The solder mass 100 is separated at this time from the lead pad 56a. This means that moving the upper portion of the solder mass 100 toward the lead pad 56a does not apply any force to the lead pad 56a. Accordingly, there is no chance that performance of the HGA will be degraded.

When the shaping tip 159 starts shaping the solder mass 100, there will be a slight decrease in the surface temperature of the shaping tip 159. Specifying a temperature of 220° C. in the system control unit 165, however, allows the temperature control unit 167 to maintain the surface temperature of the shaping tip 159 at 210±10° C. at any time including during shaping of the solder mass. This eliminates the possibility of the surface temperature of the shaping tip 159 exceeding the melting point of the solder. The surface temperature of the shaping tip 159 can thus be maintained at the highest possible temperature below the melting point in terms of performance of the solder mass shaping system 151. Softening of the solder mass 100 is accomplished through the shaping tip 159, which helps make small thermal stress applied to the head. In addition, the control for keeping the temperature of the shaping tip 159 below the melting point of the lead-free solder eliminates the possibility of the solder melting.

The upper portion of the solder mass 100 is moved toward the lead pad 56a and, as shown in FIG. 10(D), part of the solder mass 100 eventually comes into contact with the connection surface of the lead pad 56a. The system control unit 155165 causes the moving unit 165 to stop moving in the Z direction when the solder mass 100 comes into contact with the connection surface of the lead pad 56a (block 209). If the model of the HGA is the same, the size of the solder ball, the dimension of the connection surface of the slider pad, the set position of the shaping tip 159 in the X direction, spacing between the slider pad and the lead pad, and the like remain substantially constant. Accordingly, an accurate stop position of the moving unit 155 in the Z direction when the solder mass 100 comes into contact with the lead pad can be experimentally obtained in advance.

In actual shaping operations, the system control unit 165 can bring the moving unit 155 to a stop immediately after the solder mass 100 comes into contact with the lead pad 56a by instructing the moving unit 155 on the stop position in the Z direction. The position at which to stop the moving unit 155 is important in the present invention. If the moving unit 155 is allowed to move further after the solder mass 100 comes into contact with the lead pad 56a, the lead pad 56a and the metal layer of the flexure undergo plastic deformation, making the HGA unusable.

If the moving unit 155 is stopped before the solder mass 100 comes into contact with the lead pad 56a, the subsequent reflow process of irradiating the solder mass with a laser beam cannot form a good solder fillet. The distance between the solder mass 100 and the connection surface of the lead pad 56a may be monitored to establish the stop position of the moving unit 155. The steps described hitherto complete the shaping operations. In block 211, the HGA 41 is mounted on the solder ball connection apparatus. Referring to FIG. 10(E), in block 213, the solder mass 100 is irradiated with a laser beam 105. The laser beam irradiation conditions remain unchanged from those set when the solder ball is first connected, including the intensity of irradiation energy.

Since the solder mass 100 is in contact with both the slider pad 55a and the lead pad 56a, the solder fillet 101 is formed across the two pads by irradiation of the solder mass 100 with the laser beam as shown in FIG. 10(F). As described in the foregoing, only the slider pad and the lead pad, with which a defect is found during the visual check in the solder fillet formed through the first reflow process, is subjected to another reflow process to complete making the soldered connection. The slider pad 55a shrinks through heat from the first reflow process for the solder ball. The slider pad 55a further shrinks to have smaller height and width dimensions in the second reflow process for the solder mass 100. This means that there are differences in height and width dimensions greater than tolerances between a slider pad associated with a solder fillet formed through a single reflow process and a slider pad associated with a solder fillet formed through two reflow processes according to the present invention.

Referring to FIG. 11, manufacturing tolerances of about 1% are allowed for W×H dimensions of each slider pad. Each of W and H shrinks about 3% when the slider pads undergo one reflow process, as compared with the dimensions of the slider pads before the reflow process. There is shrinkage of about another 1% to 3% in W and H dimensions if the slider pads are subjected to two reflow processes according to the present invention, as compared with the slider pads that have undergone one reflow process. The slider pads are commonly formed to have the same dimensions whether they be for the write head or for the read head. Accordingly, the slider pads subjected to two reflow processes have W and H dimensions smaller by the aforementioned percentage than the slider pads subjected to one reflow process.

In another example, two slider pads for the write head are made to have the same dimensions, while two slider pads for the read head are made to have second same dimensions. The two slider pads for the write head thus have dimensions different from the two slider pads for the read head. In this case, of the two slider pads of the same kind, one slider pad subjected to two reflow processes has W and H dimensions smaller than the other slider pad subjected to one reflow process.

The manufacturing method of the HGA according to the present invention is implemented as one step of a manufacturing method of magnetic disk drives. The manufacturing processes of magnetic disk drives generally proceed as below. Specifically, each of different components, such as the magnetic disk, spindle motor, head stack assembly, circuit board, and the like, is manufactured independently and then assembled in the base. The head stack assembly is manufactured by assembling the HGA with the actuator assembly. The steps described with reference to FIG. 13 can be adopted in the manufacturing processes for the HGA.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a head gimbal assembly, the method comprising:
   providing a suspension assembly including a lead formed with a lead pad;
   mounting a head/slider formed with a slider pad on the suspension assembly;
   generating a solder mass deposited on the slider pad by irradiating with a laser beam a solder ball disposed between the slider pad and the lead pad opposing to each other at a predetermined angle;
   shaping the solder mass by softening the solder mass by heating the solder mass to a temperature equal to, or less than, a melting point of the solder mass; and
   forming a solder fillet between the slider pad and the lead pad by irradiating the shaped solder mass with a laser beam.

2. The manufacturing method according to claim 1, wherein the solder ball is formed of lead-free solder.

3. The manufacturing method according to claim 1, wherein the solder mass deposited on the slider pad is separated from a connection surface of the lead pad.

4. The manufacturing method according to claim 1,
   wherein the solder mass deposited on the slider pad takes a dome shape; and
   wherein shaping the solder mass includes moving an upper portion of the solder mass toward the lead pad, while leaving a lower portion of the solder mass behind on the slider pad.

5. The manufacturing method according to claim 1, wherein shaping the solder mass includes moving the solder mass to a position at which part of the solder mass comes into contact with the lead pad.

6. The manufacturing method according to claim 1,
wherein shaping the solder mass includes using a heated shaping tip.

7. The manufacturing method according to claim 6,
wherein using the heated shaping tip includes maintaining, while the shaping tip remains in contact with the solder mass, a surface on a leading end portion of the shaping tip in a temperature span ranging from a melting point of the lead-free solder to a value equivalent to the melting point less about 20° C.

8. The manufacturing method according to claim 6,
wherein the leading end portion of the shaping tip has a width smaller than a width of the slider pad.

9. The manufacturing method according to claim 1,
wherein the slider pad is formed by gold-plating a seed layer.

10. The manufacturing method according to claim 1, further comprising, before shaping the solder mass, determining whether or not the slider pad and the lead pad are connected by the generated solder mass,
wherein the head/slider includes two slider pads connected to a read head and two slider pads connected to a write head.

11. The manufacturing method according to claim 1,
wherein forming the solder fillet includes irradiating the solder mass with a laser beam having the same energy as the laser beam with which the solder ball is irradiated to generate the solder mass.

12. The manufacturing method according to claim 1,
wherein generating the solder mass includes irradiating the solder ball that is in contact only with the slider pad, but not with the lead pad, with a laser beam.

13. The manufacturing method according to claim 1,
wherein the suspension assembly is an integrated lead suspension assembly.

14. A method of manufacturing a magnetic disk drive including a magnetic disk, a head gimbal assembly having a head/slider for accessing the magnetic disk, and an actuator assembly for supporting the head gimbal assembly, the method comprising steps of:
providing in the head gimbal assembly a suspension assembly including a lead formed with a lead pad;
mounting the head/slider of the head gimbal assembly formed with a slider pad on the suspension assembly;
generating a solder mass deposited on the slider pad by irradiating with a laser beam a solder ball disposed between the slider pad and the lead pad opposing to each other at a predetermined angle;
shaping the solder mass by softening the solder mass by heating the solder mass to a temperature equal to, or less than, a melting point of the solder mass; and
forming a solder fillet between the slider pad and the lead pad by irradiating the shaped solder mass with a laser beam.

15. The manufacturing method according to claim 14,
wherein the solder ball is formed of lead-free solder.

16. The manufacturing method according to claim 14,
wherein the solder mass deposited on the slider pad takes a dome shape; and
wherein shaping the solder mass includes moving a shaping tip with a leading end portion thereof applied to an upper portion of the solder mass toward the lead pad.

17. The manufacturing method according to claim 16,
wherein shaping the solder mass includes bringing a moving shaping tip to a stop at a position where part of the solder mass comes into contact with the lead pad.

* * * * *